US008643127B2

(12) United States Patent
Dangtran et al.

(10) Patent No.: US 8,643,127 B2
(45) Date of Patent: Feb. 4, 2014

(54) SENSOR DEVICE PACKAGING (75) Inventors: John Dangtran, San Jose, CA (US);
Roger Horton, Sunnyvale, CA (US)

(73) Assignee: S3C, Inc., Sunnyvale, CA (US)

( * ) Notice: Subject to any disclaimer, the term of this patent is extended or adjusted under 35 U.S.C. 154(b) by 335 days.

(21) Appl. No.: 12/196,196

(22) Filed: Aug. 21, 2008

(65) Prior Publication Data
US 2010/0044809 A1    Feb. 25, 2010

(51) Int. Cl.
*H01L 29/84* (2006.01)
(52) U.S. Cl.
USPC ........... 257/415; 257/417; 257/418; 257/684; 257/E29.336; 438/50; 438/51; 438/52
(58) Field of Classification Search
USPC .......... 257/415, E29.336, E33.046, 684, 417, 257/418; 438/50, 51, 52
See application file for complete search history.

(56) References Cited

U.S. PATENT DOCUMENTS

| 3,602,777 | A |   | 8/1971  | Berman         |        |
|-----------|---|---|---------|----------------|--------|
| 3,800,264 | A |   | 3/1974  | Kurtz et al.   |        |
| 3,899,766 | A |   | 8/1975  | Mermelstein    |        |
| 4,222,277 | A |   | 9/1980  | Kurtz et al.   |        |
| 4,400,869 | A |   | 8/1983  | Wilner et al.  |        |
| 4,456,901 | A |   | 6/1984  | Kurtz et al.   |        |
| 4,523,964 | A |   | 6/1985  | Wilner et al.  |        |
| 4,622,856 | A |   | 11/1986 | Binder et al.  |        |
| 4,814,856 | A |   | 3/1989  | Kurtz et al.   |        |
| 4,994,781 | A |   | 2/1991  | Sahagen        |        |
| 5,095,401 | A |   | 3/1992  | Zavracky et al.|        |
| 5,142,912 | A | * | 9/1992  | Frische        | 73/702 |
| 5,186,055 | A |   | 2/1993  | Kovacich et al.|        |
| 5,207,102 | A |   | 5/1993  | Takahashi et al.|       |
| 5,333,505 | A |   | 8/1994  | Takahashi et al.|       |
| 5,351,550 | A |   | 10/1994 | Maurer         |        |
| 5,412,992 | A |   | 5/1995  | Tobita et al.  |        |
| 5,438,875 | A |   | 8/1995  | Fung et al.    |        |
| 5,591,679 | A |   | 1/1997  | Jakobsen et al.|        |
| 5,792,958 | A | * | 8/1998  | Speldrich      | 73/727 |
| 5,929,497 | A |   | 7/1999  | Chavan et al.  |        |

(Continued)

FOREIGN PATENT DOCUMENTS

CN    1375859 A    10/2002
CN    101088000 A    12/2007

(Continued)

OTHER PUBLICATIONS

Chinese Office Action in Application No. 200980132711.1, dated Jun. 5, 2012.

(Continued)

*Primary Examiner* — Thinh T Nguyen
(74) *Attorney, Agent, or Firm* — Nixon Peabody LLP (57) ABSTRACT

A sensor device and a method of forming comprises a die pad receives a sensor device, such as a MEMS device. The MEMS device has a first coefficient of thermal expansion (CTE). The die pad is made of a material having a second CTE compliant with the first CTE. The die pad includes a base and a support structure with a CTE compliant with the first and second CTE. The die pad has a support structure that protrudes from a base. The support structure has a height and wall thickness which minimize forces felt by the die pad and MEMS device when the base undergoes thermal expansion or contraction forces from a header.

18 Claims, 4 Drawing Sheets

(56) References Cited

U.S. PATENT DOCUMENTS

| | | | |
|---|---|---|---|
| 5,973,590 A | 10/1999 | Kurtz et al. | |
| 5,994,161 A | 11/1999 | Bitko et al. | |
| 6,050,145 A * | 4/2000 | Olson et al. | 73/706 |
| 6,109,113 A | 8/2000 | Chavan et al. | |
| 6,255,728 B1 | 7/2001 | Nasiri et al. | |
| 6,272,928 B1 | 8/2001 | Kurtz | |
| 6,311,561 B1 | 11/2001 | Bang et al. | |
| 6,474,170 B1 * | 11/2002 | Yamagishi et al. | 73/723 |
| 6,505,811 B1 | 1/2003 | Barron et al. | |
| 6,550,337 B1 * | 4/2003 | Wagner et al. | 73/715 |
| 6,623,984 B1 | 9/2003 | Fleischman et al. | |
| 6,713,828 B1 | 3/2004 | Chavan et al. | |
| 6,718,830 B1 | 4/2004 | Johnson | |
| 6,732,589 B2 | 5/2004 | Eickhoff et al. | |
| 6,750,478 B2 | 6/2004 | Yoshida et al. | |
| 6,845,664 B1 | 1/2005 | Okojie | |
| 6,938,490 B2 | 9/2005 | Wagner et al. | |
| 6,945,120 B1 * | 9/2005 | Marcus et al. | 73/756 |
| 6,948,374 B2 | 9/2005 | Miyashita | |
| 7,004,035 B2 | 2/2006 | Saito et al. | |
| 7,105,902 B2 | 9/2006 | Asami et al. | |
| 7,135,749 B2 | 11/2006 | Sakai et al. | |
| 7,152,483 B2 * | 12/2006 | Mast | 73/754 |
| 7,181,972 B2 | 2/2007 | Dasgupta et al. | |
| 7,183,620 B2 | 2/2007 | Kurtz et al. | |
| 7,216,547 B1 | 5/2007 | Stewart et al. | |
| 7,231,828 B2 | 6/2007 | Kurtz et al. | |
| 7,258,018 B2 | 8/2007 | Kurtz et al. | |
| 7,270,009 B2 | 9/2007 | Miyashita | |
| 7,401,525 B2 | 7/2008 | Cobianu et al. | |
| 7,499,604 B1 | 3/2009 | Burns | |
| 7,518,234 B1 | 4/2009 | Okojie | |
| 7,644,625 B2 | 1/2010 | Ricks | |
| 7,775,119 B1 | 8/2010 | Suminto et al. | |
| 8,215,176 B2 | 7/2012 | Ding et al. | |
| 8,297,125 B2 | 10/2012 | Stewart et al. | |
| 8,316,533 B2 | 11/2012 | Suminto et al. | |
| 8,373,240 B2 | 2/2013 | Elian et al. | |
| 2001/0009195 A1 | 7/2001 | Solanki et al. | |
| 2002/0029639 A1 * | 3/2002 | Wagner et al. | 73/756 |
| 2004/0041254 A1 | 3/2004 | Long et al. | |
| 2004/0077117 A1 | 4/2004 | Ding et al. | |
| 2004/0155243 A1 | 8/2004 | Asami et al. | |
| 2005/0035446 A1 | 2/2005 | Karpman et al. | |
| 2005/0056870 A1 | 3/2005 | Karpman et al. | |
| 2005/0093134 A1 | 5/2005 | Tarn | |
| 2005/0100290 A1 | 5/2005 | Huang | |
| 2005/0115811 A1 | 6/2005 | Receveur et al. | |
| 2006/0144153 A1 | 7/2006 | Brosh | |
| 2006/0197215 A1 | 9/2006 | Potter | |
| 2006/0213276 A1 | 9/2006 | Ueyanagi et al. | |
| 2007/0228499 A1 | 10/2007 | Dangtran et al. | |
| 2008/0006092 A1 | 1/2008 | Brida et al. | |
| 2008/0099861 A1 | 5/2008 | Dangtran | |
| 2008/0277747 A1 | 11/2008 | Ahmad | |
| 2008/0308920 A1 | 12/2008 | Wan | |
| 2010/0122583 A1 | 5/2010 | Rozgo et al. | |
| 2013/0137207 A1 | 5/2013 | Suminto et al. | |

FOREIGN PATENT DOCUMENTS

| | | |
|---|---|---|
| DE | 10347418 | 5/2005 |
| DE | 102004045854 | 4/2006 |
| EP | 0033749 A1 | 8/1981 |
| JP | H09292298 A | 11/1997 |
| JP | H11351990 A | 12/1999 |
| JP | 2000193548 A | 7/2000 |
| JP | 2001074577 A | 3/2001 |
| JP | 2001330529 A | 11/2001 |
| JP | 2002214059 A | 7/2002 |
| JP | 2003214761 A | 7/2003 |
| JP | 2008002994 A | 1/2008 |
| JP | 2009243492 A | 10/2009 |
| WO | 8801049 | 2/1988 |
| WO | 9801049 | 1/1998 |
| WO | 2004074168 | 9/2004 |
| WO | 2007060290 A1 | 5/2007 |
| WO | 2007117447 | 10/2007 |
| WO | 2008036701 A2 | 3/2008 |
| WO | 2008060389 | 5/2008 |

OTHER PUBLICATIONS

"SM5102: OEM Silicon Pressure Die," 2001-2002, Silicon Microstructures Incorporated, Milpitas, CA.

"SM5112: Harsh Environment Absolute Silicon Pressure Die," 2003, Silicon Microstructures Incorporated, Milpitas, CA.

Adapt, in Merriam-Webster Online Dictionary, www.merriam-webster.com/dictionary/adapt, (year 2010).

Concentric, in Merriam-Webster Online Dictionary, Retrieved Jun. 18, 2009, from www.merriam-webster.com/dictionary/concentric.

Bauer, "First High Volume Trough Silicon Via Process for MEMS," Silex Microsystems. Presented at the Micromachines 2007 Conference in Tokyo, Japan.

Fairchild et al., "Emerging Substrate Technologies for Harsh-Environment Automotive Electronics Applications," SAE 2002 World Congress, Mar. 4-7, 2002, Detroit, Michigan.

Miniature Silicon-on-Insulator Pressure Transducer for Absolute Pressure Measurement at 260 C, Endevco Corporation, San Juan Capistrano, CA and Meggitt PLC, Dorset, UK, Measurement Endeavors TM, Aug. 2007.

Petrovic et al., "Reliability Test Methods for Media-Compatible Pressure Sensors," IEEE Transactions on Industrial Electronics, vol. 45, No. 6, Dec. 1998, pp. 877-885.

International Search Report from International Application No. PCT/US2007/008278, mailed Nov. 13, 2007, 3 pages.

International Search Report from International Application No. PCT/US2010/026024, mailed May 4, 2010, 1 page.

International Search Report from International Application PCT/US2007/022336, dated Jul. 11, 2008, 3 pages.

U.S. Appl. No. 12/196,196, Entitled: "Sensor Device Packaging and Method," filed Aug. 21, 2008.

Office Action in U.S. Appl. No. 11/544,089, dated May 28, 2009.

Office Action in U.S. Appl. No. 11/544,089, dated Jan. 22, 2010.

Office Action in U.S. Appl. No. 11/544,089, dated May 12, 2010.

Office Action in U.S. Appl. No. 11/544,089, dated Sep. 27, 2010.

Office Action in U.S. Appl. No. 11/975,618, dated Jun. 25, 2009.

Office Action in U.S. Appl. No. 12/151,771, dated Sep. 30, 2009.

Office Action in U.S. Appl. No. 12/151,771, dated May 26, 2010.

European Office Action in European Application No. 07754751.1, dated Mar. 18, 2010.

International Search Report and Written Opinion in International Application No. PCT/US2009/054692, mailed Oct. 9, 2009.

Chinese Office Action in Chinese Application No. 200980132711.1, mailed Mar. 1, 2013.

Japanese Office Action in Japanese Application No. 2011-524055, mailed Jan. 22, 2013.

Office Action in U.S. Appl. No. 12/151,771, mailed Aug. 30, 2011.

Office Action in U.S. Appl. No. 12/151,771, mailed May 15, 2012.

Office Action in U.S. Appl. No. 12/151,771, mailed Feb. 12, 2013.

Office Action in U.S. Appl. No. 12/151,771, mailed Jul. 11, 2013.

Notice of Allowance in U.S. Appl. No. 12/397,253, mailed Apr. 2, 2010.

Office Action in U.S. Appl. No. 12/855,528, mailed Dec. 12, 2011.

Office Action in U.S. Appl. No. 12/855,528, mailed Apr. 24, 2012.

Notice of Allowance in U.S. Appl. No. 12/855,528, mailed Jul. 20, 2012.

Office Action in U.S. Appl. No. 13/620,427, mailed May 22, 2013.

Notice of Allowance in U.S. Appl. No. 13/620,427, mailed Sep. 12, 2013.

(56) References Cited

OTHER PUBLICATIONS

Chinese Office Action in Application No. 201080010485.2, mailed Jan. 30, 2013.
Extended European Search Report in European Application No. 10749253.0, mailed Jul. 8, 2013.
Japanese Office Action in Japanese Application No. 2011-553069 mailed on Mar. 5, 2013.
Gao et al., "Development of Thermally Excited Si Resonant Pressure Sensor", Instrument Technique and Sensor, No. 4, Apr. 30, 2004.
Chen, "Research on Micromachined Resonant Beam Pressure Sensors", Chinese Selected Doctoral Dissertations and Master's Theses Full-Text Databases (Dotoral) Series Information Science and Technology, No. 2, Dec. 15, 2002.
Office Action in Chinese Application No. 200980132711.1, issued Sep. 26, 2013.

* cited by examiner

FIG. 5

SENSOR DEVICE PACKAGING

TECHNICAL FIELD

The present disclosure relates generally to sensor system packages and method of manufacturing thereof.

BACKGROUND

The use of MEMS (micro-electro-mechanical systems) sensors is becoming widespread in applications where a small sensor is needed and low cost is important. In applications where the sensor is exposed to harsh environments, such as that in refrigeration and AC systems, a backside entry sensor device is used because the top side of the sensor, which usually contains the piezo-resistive elements and connections to the package, cannot be exposed to the harsh conditions in the environment.

Support structures have a high thermal expansion mismatch between the support material and the MEMS sensor. This mismatch may cause strain, unrelated to pressure, which results in unintended results and errors in the sensor measurements. Accordingly, minimal or stress free installation of the MEMS die is an important aspect of making reliable and better performing pressure sensors.

One method to reduce the strain between the MEMS sensor and the support structure is to use a thermally compliant die attach made of a silicone elastomer. However silicone elastomers may not provide a hermetic seal, thereby allowing gas or liquid to leak into the section of the sensor device having the electronic components therein when high temperatures or pressures are present in the environment surrounding the sensor device. This may cause the sensor device to leak, thereby adversely affecting the sensor readings and yielding inconsistent and inaccurate measurements. In addition, refrigeration systems and sensor systems therein are not allowed any gas or liquid leaks for environmental safety reasons as regulated by the Environmental Protection Agency (EPA).

OVERVIEW

In an aspect, a sensor device package comprises a header having a first surface and a second surface. The header includes a conduit between the first and second surfaces and an aperture in the first surface, wherein the aperture is in communication with the conduit. A die pad has a base and a support structure extending from the base. The support structure is adapted to receive a MEMS device thereon, wherein the MEMS device has a coefficient of thermal expansion (CTE) and the die pad has a CTE substantially compliant with the CTE of the MEMS device. The base of the die pad is hermetically sealed to the conduit of the header, wherein the support structure has a dimension that is configured to minimize forces between the header and the die pad when the die pad undergoes thermal expansion or contraction in the conduit.

In an aspect, a sensor device package comprises a MEMS device which has a first coefficient of thermal expansion (CTE), wherein the MEMS device has a port aperture on a bottom surface. A die pad is adapted to receive the MEMS device on a top surface. The die pad is made of a material having a second CTE which is substantially compliant with the first CTE. The die pad includes a first conduit running therethrough to deliver media to the port aperture of the MEMS device. The die pad includes a base and a support structure which has a third CTE compliant with the first CTE and second CTE. The support structure is configured to minimize forces at the interface of the die pad and the MEMS device when the die pad undergoes thermal expansion or contraction. The support structure preferably protrudes from the base. The die pad includes a second conduit running therethrough in communication with the first conduit, wherein the second conduit in the base has a diameter larger than a diameter in the support structure.

In an aspect, a method for forming a sensor device package comprises forming a die pad adapted to receive a MEMS device thereon. The MEMS device has a first coefficient of thermal expansion (CTE), wherein the die pad is made of a material having a second CTE that is substantially compliant with the first CTE. The die pad has a base and a support structure which protrudes from the base. The method includes coupling the die pad to a receiving aperture of a header package, preferably by a metal flow procedure, wherein the support structure has a height dimension and a wall thickness that are configured to minimize forces at the MEMS device when the die pad undergoes thermal expansion or contraction forces from the header package.

In any or all of the above aspects, the die pad may be made of Invar, Kovar, glass, silicon, or a ceramic material. In an embodiment, a header is configured to receive the die pad therein, wherein the header is made of steel or aluminum. In an embodiment, the base has a wall thickness which is greater than a wall thickness of the support structure. In an embodiment, the pedestal is coupled to the support structure by a laser welding process or alternatively are integrally formed. In an embodiment, the die pad is configured to receive the MEMS device and at least one other device, wherein the other device may be an integrated circuit device. In an embodiment, the die pad includes a conduit passing from a bottom surface to a top surface to define a first aperture in the top surface, the first aperture adapted to be in communication with a corresponding aperture of the MEMS device, wherein the first aperture has a diameter smaller than the corresponding aperture of the MEMS device.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a sensor system. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

In general, the specification describes one or more embodiments directed to packaging for housing a sensor or other device(s) in which the packaging is subject to stresses and configured to prevent those stresses from affecting the devices housed therein. The sensor package described herein utilizes a die pad and support structure made of a material having a low coefficient of thermal expansion (CTE) which prevents outside forces from affecting the sensor device and also allows the die pad and support structure to easily be attached to the header as well as provide a very low cost die pad and support structure for the sensor device.

It is preferred that the sensor device is a MEMS (Microelectro-mechanical system), however the packaging may be additionally or alternatively used for other types of devices such as ASICs, ICs, etc. The subject matter described herein allows the inexpensive manufacture of an effective sensor system which may be used for absolute and relative sensors, gage type sensors, AC and refrigeration systems sensors, braking sensors and/or other engine control sensors in vehicles, industrial and/or medical equipment. The MEMS may be a pressure sensor, temperature sensor, Hall effect sensor, electromagnetic sensor and sensor arrays, humidity sensor, optical sensor, gyroscope, accelerometer, piezoelectric sensor or transducer, and a display. The particulars of how the MEMS is constructed is not described herein, but it should be noted that any type of MEMS or similar device is contemplated for use with the package described herein.

Figure 1:
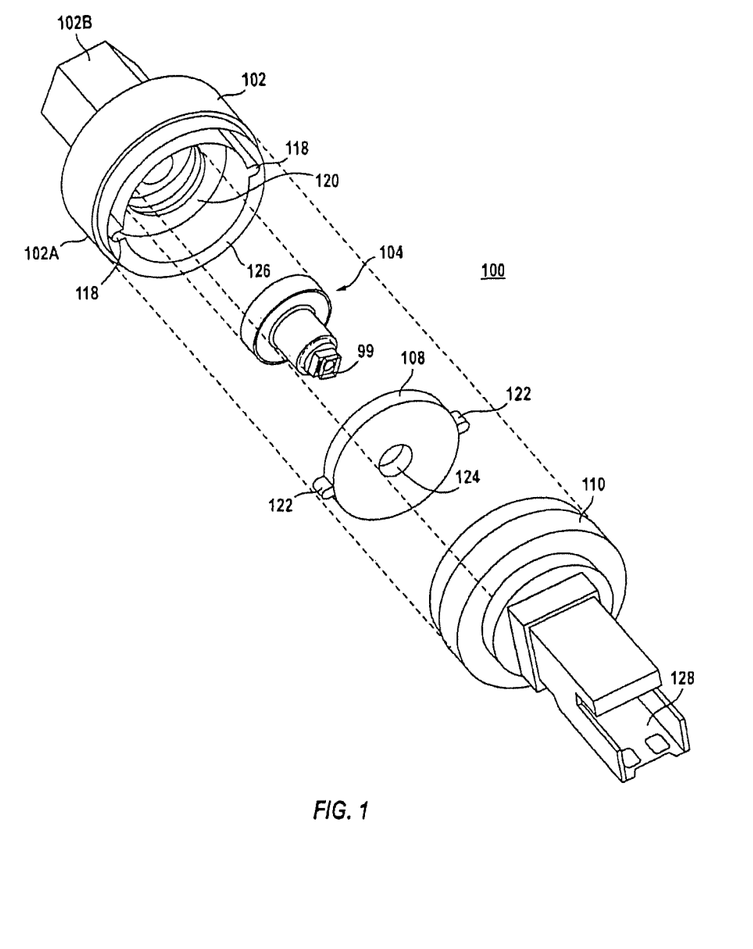
FIG. 1 illustrates an exploded view of the sensor system package in accordance with one or more embodiments.

FIG. 1 illustrates an exploded view of the sensor system package in accordance with an embodiment. As shown in FIG. 1, the sensor system package 100 includes a header 102, a die pad 104 having a sensor device 99 is mounted thereon. A printed circuit board 108 and a connection cap 110 are coupled to the assembly to form the overall package 100. It should be noted that additional and/or alternative components may be utilized in the sensor system 100 without departing from the scope of the claimed embodiments herein. It should also be noted that the alternative configurations of the package 100 are contemplated as discussed below.

The header 102 includes an upper portion 102A and a lower portion 102B, whereby the lower portion 102B connects, via a pressure port, the sensor system package 100 to a relatively highly pressurized environment which is being measured by the system 100. The lower portion 102B is shown as a bolt member in FIG. 1, but may have any other appropriate designs based on the port configuration of the item to which the header 102 is coupled. For example, the bottom portion 102B of the header may have a threaded outer surface (instead of a threaded inner surface) to allow the header to be screwed into a mounting port.

The upper portion 102A of the header 102 in FIG. 1 is made of a metal in an embodiment. For example, the header could be made from any type of stainless steel (e.g. 304, 316 series, etc.), aluminum, alloys, composites or other materials which can made by machining, casting or molding such as metal injection molding where appropriate.

As shown in FIG. 1, the header 102 is also configured to receive a printed circuit board (PCB) 108 in a second recess having a PCB seating area 120 in the upper portion 102A in an embodiment. In an embodiment, the PCB 108 is coupled to the seating area 120 by an adhesive, although any other appropriate coupling method is contemplated. In an embodiment, the PCB 108 includes guide extensions 122 which fit within corresponding notches 118 in the header 102 when the PCB 108 is received in the PCB seating area 120. In an embodiment, the guide extensions 122 are keyed, such that the PCB 108 will only properly fit within the PCB seating area 120 when properly oriented. In an embodiment, the PCB has a donut configuration which includes an aperture 124 which extends therethrough at a center, whereby the aperture 124 is configured to be aligned with the sensor 99 and thus surround the sensor 99 when the PCB 108 is mounted to the header 102. In an embodiment, the sensor 99 is wire bonded to the PCB 108, although any other appropriate electrical coupling method is contemplated. The aperture 124 of the PCB 108 also allows electrical connections to be easily made between the sensor 99, the PCB 108 and the connection cap 110.

The connection cap 110 fits into the outer recess 126 in the upper portion 102B and fits over the components and electronics within the upper portion 102B of the header 102. The connection cap 110 may be mounted to the header 102 by any appropriate methods. The connection cap 110 includes an electrical connection port 128 which allows power, signals and/or data to flow between the sensor system 100 and any other electrical components.

Figure 2A:
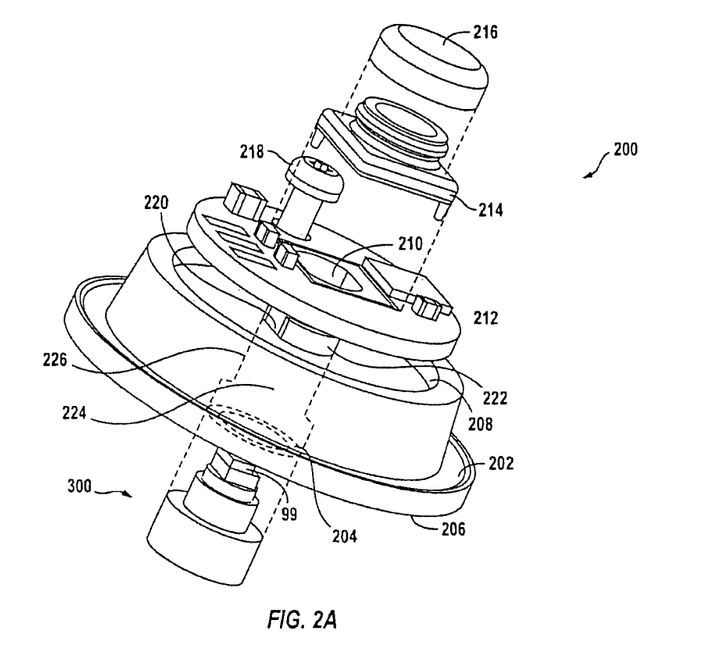
FIGS. 2A and 2B illustrate views of the sensor system package in accordance with one or more embodiments.
Figure 2B:
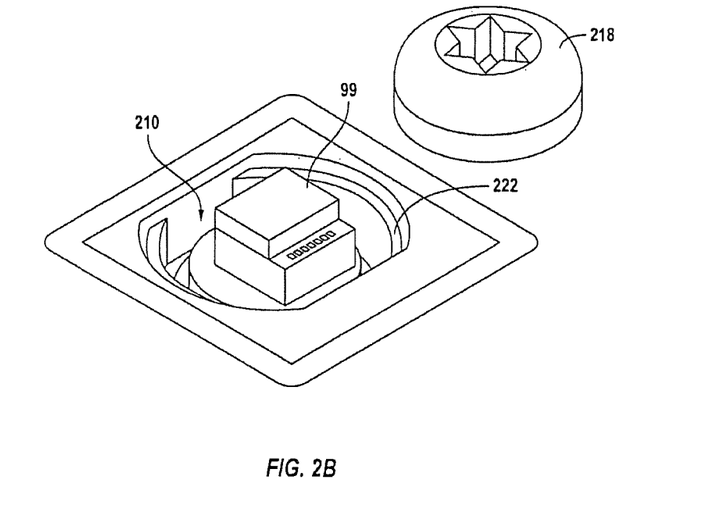

FIGS. 2A and 2B illustrate another embodiment of the system 200 in which the die pad 300 and sensor device 99 are inserted through an aperture 204 in the bottom surface 206 of a header 202, whereby the aperture 204 is in communication with the internal conduit 224 which is discussed in more detail below. In addition, the PCB board 212 is coupled into a top recess 208 of the header 202 and secured using adhesives or more screws. In particular, the die pad 300, and sensor device 99 (herein referred to the "die pad assembly") is preferably crimped or secured to securely mount and hermetically seal the die pad assembly to the header 202. Upon being mounted to the header 202, the sensor device 99 is exposed in an aperture 220 in the header 202, in an embodiment. An aperture 210 through the PCB 212 is positioned such that the aperture 210 is aligned with the header aperture 220. In an embodiment, the header 202 includes a collar 222 which surrounds the aperture 220, whereby the collar 222 fits within the aperture 210 of the PCB board 212 to ensure alignment and secure the PCB board 212 to the header. FIG. 2B illustrates a detailed view of the sensor device 99 at least partially surrounded by the collar 222 and the aperture 210. A cover bracket 214 and a corresponding cover 216 are coupled to the top surface PCB assembly 212 to protect the sensor device 99. It should be noted that the die pad package described herein is not limited to the systems described in FIGS. 2A and 2B and may be used in a variety of different systems in a variety of applications.

Figure 3A:
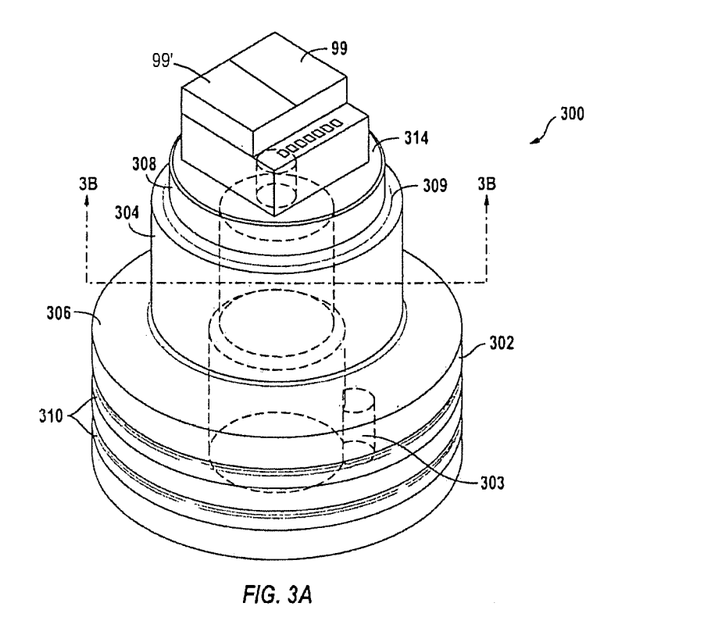
FIG. 3A illustrates a perspective view of a die pad in accordance with an embodiment.
Figure 3B:
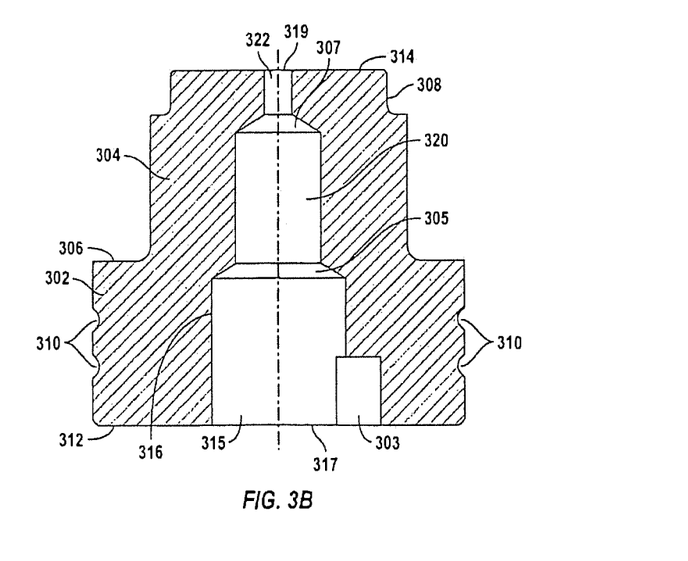
FIG. 3B illustrates a cross-sectional view of the die pad in FIG. 2A in accordance with an embodiment.

FIG. 3A and 3B illustrate the die pad in accordance with an embodiment. As shown in FIGS. 3A and 3B, the die pad 300 includes a base 302, a support structure 304 protruding upwards from the base 302, and a pedestal 308 protruding from a top surface of the support structure 304. The base includes a keyhole 303 on its bottom surface which aligns the die pad 300 to the header 202 during the manufacturing process. The pedestal 308 is configured to receive a MEMS device 304. In the embodiment in FIG. 3A, the support structure 304 has a diameter which is smaller than the diameter of the base 302. The support structure 304 protrudes a height above a top surface 306 of the base 302 to ensure that stresses applied to the base 302 are minimized at the sensor device 99. The pedestal 308 is located at the top surface 309 of the support structure 308 and has a height dimension as well as a diameter which is smaller than the diameter of the support structure 308. Although the support structure 304 and the pedestal 308 are shown as being circular in FIG. 3A, the support structure 304 and the pedestal 308 may have any alternate shape and do not necessarily require having the same shape. It is preferred that the base 302, support structure 304 and pedestal 308 are formed as one piece and are made of the same material. As shown in FIG. 3B, the support structure 300 has an internal conduit 316 which traverses from the bottom surface 312 of the lower portion 302B to the top surface 314 of the die pad 304.

FIG. 3B illustrates a cross sectional view of the die pad 300 along lines 3B-3B in accordance with an embodiment. In an embodiment, the internal conduit 316 preferably has a stepped configuration in which the diameter of the internal conduit 316 becomes smaller as it traverses from the bottom surface 312 of the base 302 to the top surface 314 of the die pad 300. The conduit 316 shown in FIG. 3B preferably has a bottom portion 315, a middle portion 320 and an upper portion 322. The bottom portion 315 is in communication with the aperture 317 in the bottom surface 312 of the die pad 300. The upper portion 322 is in communication with the aperture 319 in the top surface 314 of the die pad 300. In particular, the middle portion 320 of the conduit 316 has a diameter which is smaller than the diameter in the lower portion 315 but larger than the diameter in the upper portion 322 in the die pad 300. Transition sections 305 and 307 have a tapering shape which transition between the portions of different diameters and are optional. It should be noted that other configurations of the conduit are contemplated and are not limited to that shown in FIG. 3B. In an embodiment, the diameter of the inner conduit 316 is substantially constant throughout the support structure 300.

The die pad 300 is coupled to a source of pressurized media, whereby in an embodiment, the sensor device 99 measures one or more conditions of the media. The media (e.g. gas, liquid, or mixture thereof) travels upwards via the lower portion 315 of the conduit 316 through aperture 317 and through the middle portion 320 to the upper portion 322 of the conduit to aperture 319 into the sensor device 99 (FIG. 3A). Upon reaching the underside of the sensor device 99, the sensor device 99 measures a desired characteristic of the media (e.g. pressure, temperature, etc.).

Figure 4:
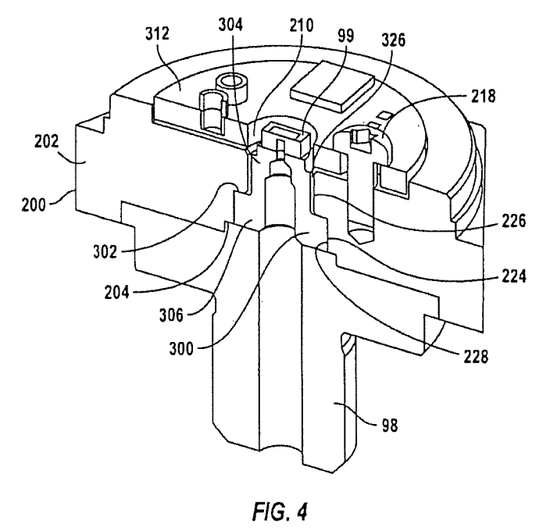
FIG. 4 illustrates a broken view of the sensor system package in accordance with an embodiment.

FIG. 4 illustrates a perspective view of the die pad mounted within the receiving aperture 204 of the header 202. In particular to the embodiment in FIG. 4, the receiving aperture 204 of the header 202 is in communication with the conduit 224 which preferably has a lower portion 228 and an upper portion 226, whereas the lower portion 228 has a diameter which is larger than the diameter of the upper portion 226. With respect to the die pad 300, the lower portion 228 of the conduit 224 is substantially the same in diameter to the diameter of the base 302, whereas the diameter of the upper portion 226 is slightly larger than that of the support structure 304.

As stated, the configuration of the die pad 300 minimizes stresses applied by the header 202 to the sensor device 99, particularly heat variation during use. The structure of the die pad 300 is such in relation to the header 202 that the die pad 300 isolates the sensor device 99 from experiencing the thermal stresses and strains which are applied to the die pad 300 during operation (eg. when the sensor package is used in a refrigeration system). In particular, the larger dimensioned base 302 receives the various stresses and strains from the header 202 and the support structure 304 has height and wall thickness dimensions which inhibit those applied stresses and strains from reaching the sensor device 99. Thus, at the appropriate height and wall thickness dimensions, the forces from the header 202 will diminish as they travel from the base 302 along the support structure 304 such that the sensor device 99 will not experience any adverse or negative force effects. Further, the difference in the outer diameters between the support structure 304 and the upper portion 226 of the header prevents stresses being transmitted directly to the support structure 304 and therefore to the sensor device 99 due to thermal expansion and contraction between the diepad 300 and the header 202.

In an embodiment, the base 302 has an overall outer diameter of 6.5 millimeters (mm) and a height of the base is 2.8 mm. The lower portion 315 of the conduit 316 has a diameter of 2.5 mm. In addition, the support structure 304 has an outer diameter of 4.5 mm, a height of 3.5 mm and wall thickness of 2.0 mm. It should be noted that the above described dimensions of the components described herein are provided as an example for one or more applications in which the header 202 is made of aluminum and the die pad 300 made of Kovar or Invar. Thus, it is contemplated that the assembly will have different dimensions based upon the application in which it is used as well as the type of materials of the individual components of the assembly.

The die pad 300 preferably has a set of grooves 310 along the outer surface of the base 302. The grooves 310 receive the flowed metal during the mounting operation such that the die pad 300 tightly fits within the receiving aperture 204 and lower portion 228 of the header 202.

In an embodiment, at least a portion of the die pad 300 is covered with a Ni or Ni/Au plating layer to provide corrosion protection and an oxide free surface to attach the MEMS onto the die pad 300. In an embodiment, the die portion of the MEMS 99 is attached to the die pad 300 using a Au/Sn (80/20) eutectic alloy to create a hermetic seal therebetween. It should be noted, however, that the above mentioned eutectic alloy is just an example and other compositions are contemplated.

Further, other coupling technologies besides a eutectic alloy may be employed to attach the MEMS 99 to the die pad 300.

The top surface of the pedestal 308 is configured to receive the bottom surface of the sensor device 99 (FIG. 2B). In an embodiment, the bottom surface of the sensor device 99 is made of a metallized glass, whereby the metallized glass is solder attached to the top surface of the pedestal 308. In an embodiment, the sensor device 99 is a MEMS device which may be made of silicon and glass. Other combinations of materials such as silicon are contemplated. In addition to the gold/tin, tin based soft solder materials for die attach are also contemplated. The dimensions of the top surface of the pedestal 308 are preferably larger than the corresponding dimensions of the sensor device 99 to prevent overhang of the sensor device 99 with respect to the top surface of the pedestal 308.

It has been found that the relative sizes of the aperture in the die pad with the aperture of the sensor device may be very important, especially when the sensor device is attached to the die pad using a eutectic solder. For example, for a sensor device having an interface surface which is made of metallized glass, the eutectic solder may cause stress on the overhanging edge of the aperture port, thereby resulting in cracking of the glass around the aperture port of the interface surface. Accordingly, it is preferred that the aperture on the top surface of the die pad be smaller in diameter than the receiving port of the sensor device. In an embodiment, it is preferred that the aperture on the top surface of the die pad is 0.35 mm-0.50 mm in diameter for a sensor device having an interface port diameter of 0.8 mm. It should be noted that other diameters of the receiving platform aperture are contemplated based on the port diameter of the sensor device and are not limited to the range of diameters described above.

It should be noted that although the die pad 300 is shown in the figures holding only one sensor device 99, the die pad 300 may be configured to accommodate more than one electronic device. For example, the die pad 300 may be configured to hold one or more sensor devices 99' as well as one or more integrated circuits (IC) and/or application specific integrated circuits (ASIC) devices.

Although it is discussed that the pedestal 308 is integrally formed with the support structure and base of the die pad, the pedestal 308 may be laser welded to the top surface of the support structure 304. Alternatively, the pedestal 308 may be eutectic soldered after applied with the Ni/Au plating. The pedestal 308 and remaining portion of the die pad 300 as well as the coupled areas between the two may be selectively plated.

Figure 5:
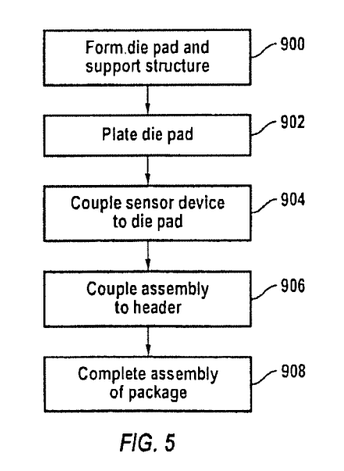
FIG. 5 illustrates a flow chart of the production and assembly process of the sensor system in accordance with an embodiment.

FIG. 5 illustrates a flow chart of the production and assembly process of the sensor assembly in accordance with an embodiment. Initially, the die pad is formed (900) by machining, stamping, metal injection molding, or other appropriate methods. In an embodiment, the support structure is then plated (902) with an anti-corrosion material such as a Ni/Au coating. The coating can be of other materials depending on the material of the die pad.

Thereafter, the sensor device 99, a MEMS device in an embodiment, is coupled to the receiving platform of the pedestal (904), preferably using a eutectic soldering process. Again, other coupling methods besides a eutectic soldering process are contemplated based on the materials of the die pad and the sensor device.

In 910, the die pad 300 along with the sensor device 99 is preferably coupled to the header 202. In one example embodiment, the die pad 300 along with the sensor device 99 is inserted into a bottom aperture 204 in the header 202, whereby the differences in diameter between the base 302 and the lower portion 224 of the receiving aperture are such that the die pad 300 undergoes a snug fit within the aperture 300.

In the example, the header 202 is preferably held on a pressing machine whereby a punching tool applies a force onto the bottom surface 206 of the header 202 such that the pressure on the metal header 202 causes the interior of the lower portion 224 of the receiving aperture to flow inward toward the outer surface of the base 302. As stated above, the base 302 preferably includes grooves 310 (FIG. 3A) which the flowed metal fills, thereby tightly fitting the die pad 300 within the header 202. This is then followed by any other components such as a PCB board to complete the manufacture and assembly of the sensor package (908). It should be noted that the above is an example preferred method of manufacturing the sensor package and that other methods having additional and/or alternative steps are contemplated.

In an aspect, a sensor device package comprises a header having a first surface and a second surface. The header includes a conduit between the first and second surfaces and an aperture in the first surface, wherein the aperture is in communication with the conduit. A die pad has a base and a support structure extending from the base. The support structure is adapted to receive a MEMS device thereon, wherein the MEMS device has a coefficient of thermal expansion (CTE) and the die pad has a CTE substantially compliant with the CTE of the MEMS device. The base of the die pad is hermetically sealed to the conduit of the header, wherein the support structure has a dimension that is configured to minimize forces between the header and the die pad when the die pad undergoes thermal expansion or contraction in the conduit.

In an aspect, a sensor device package comprises a MEMS device which has a first coefficient of thermal expansion (CTE), wherein the MEMS device has a port aperture on a bottom surface. A die pad is adapted to receive the MEMS device on a top surface. The die pad is made of a material having a second CTE which is substantially compliant with the first CTE. The die pad includes a first conduit running therethrough to deliver media to the port aperture of the MEMS device. The die pad includes a base and a support structure which has a third CTE compliant with the first CTE and second CTE. The support structure is configured to minimize forces at the interface of the die pad and the MEMS device when the die pad undergoes thermal expansion or contraction. The support structure preferably protrudes from the base. The die pad includes a second conduit running therethrough in communication with the first conduit, wherein the second conduit in the base has a diameter larger than a diameter in the support structure.

In an aspect, a method for forming a sensor device package comprises forming a die pad adapted to receive a MEMS device thereon. The MEMS device has a first coefficient of thermal expansion (CTE), wherein the die pad is made of a material having a second CTE that is substantially compliant with the first CTE. The die pad has a base and a support structure which protrudes from the base. The method includes coupling the die pad to a receiving aperture of a header package, preferably by a metal flow procedure, wherein the support structure has a height dimension and a wall thickness that are configured to minimize forces at the MEMS device when the die pad undergoes thermal expansion or contraction forces from the header package.

In any or all of the above aspects, the die pad may be made of Invar, Kovar, glass, silicon, or a ceramic material. In an embodiment, a header is configured to receive the die pad therein, wherein the header is made of steel or aluminum. In an embodiment, the base has a wall thickness which is greater than a wall thickness of the support structure. In an embodiment, the pedestal is coupled to the support structure by a laser welding process or alternatively are integrally formed. In an embodiment, the die pad is configured to receive the MEMS device and at least one other device, wherein the other device may be an integrated circuit device. In an embodiment, the die pad includes a conduit passing from a bottom surface to a top surface to define a first aperture in the top surface, the first aperture adapted to be in communication with a corresponding aperture of the MEMS device, wherein the first aperture has a diameter smaller than the corresponding aperture of the MEMS device.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A sensor device package comprising:
a header having a first surface and a second surface, the header including a header conduit between the first and second surfaces; and
a die pad having a base and a support structure extending from the base, the support structure to receive a MEMS device thereon, the MEMS device having a first coefficient of thermal expansion (CTE) and the die pad having a second CTE similar to the first CTE, wherein the base of the die pad is hermetically sealed to the header conduit,
wherein the base and support structure are formed of one piece of the same material and the support structure has a dimension to minimize forces between the header and the die pad when the die pad undergoes thermal expansion or contraction in the header conduit.

2. The sensor device package of claim 1, wherein the die pad comprises a material selected from the group consisting of an iron-nickel-cobalt alloy, a nickel steel alloy, glass, silicon, and ceramic.

3. The sensor device package of claim 1, wherein the header comprises steel.

4. The sensor device package of claim 1, wherein the header comprises aluminum.

5. The sensor device package of claim 1, wherein the base has a wall thickness which is greater than a wall thickness of the support structure.

6. The sensor device package of claim 1, further comprising a pedestal positioned between the MEMS device and the support structure.

7. The sensor device package of claim 6, wherein the pedestal and the support structure are integrally formed.

8. The sensor device package of claim 1, wherein the die pad includes a Nickel-Gold layer thereon.

9. The sensor device package of claim 1, wherein the MEMS device includes a port, and wherein the die pad includes an aperture, wherein the aperture is in communication with the port, and wherein the aperture has a diameter smaller than the port.

10. The sensor device package of claim 1, wherein the support structure protrudes from the base.

11. The sensor device package of claim 1, wherein the die pad includes a die pad conduit passing through the base and having a first diameter in the base and passing through the support structure and having a second diameter in the support structure, the second diameter being smaller than the first diameter.

12. The sensor device package of claim 1, wherein the die pad comprises a iron-nickel-cobalt alloy.

13. The sensor device package of claim 1, wherein the die pad is in the header conduit.

14. The sensor device package of claim 1, wherein the header conduit defines a metal flow area for flow of metal in crimping the base of the die pad to the header.

15. The sensor device package of claim 1, wherein the MEMs device is mounted to the support structure with solder.

16. The sensor device package of claim 1, wherein the support structure has a diameter that is smaller than a diameter of the base.

17. The sensor device package of claim 1, wherein the support structure has a height that is greater than a height of the base.

18. The sensor device package of claim 1, wherein the base has an outer diameter of 6.5 mm and a height of 2.8 mm, the conduit has a diameter of 2.5 mm, and the support structure has an outer diameter of 4.5 mm, a height of 3.5 mm and a wall thickness of 2.0 mm.

* * * * *